US007135849B1

(12) United States Patent
Yamamoto

(10) Patent No.: US 7,135,849 B1
(45) Date of Patent: Nov. 14, 2006

(54) EXTREMAL VOLTAGE DETECTOR WITH HIGH INPUT IMPEDANCE

(75) Inventor: Syouhei Yamamoto, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/408,988

(22) Filed: Apr. 24, 2006

(30) Foreign Application Priority Data

Jun. 9, 2005 (JP) ............................ 2005-169060

(51) Int. Cl.
*G01R 19/04* (2006.01)

(52) U.S. Cl. ............................ 324/103 P; 324/123 R; 323/316

(58) Field of Classification Search ............ 324/103 P, 324/123 R, 769, 73.1, 158.1; 323/314–316; 327/58–71
See application file for complete search history.

(56) References Cited

U.S. PATENT DOCUMENTS 4,977,338 A * 12/1990 Miyaoka et al. ............ 326/109

FOREIGN PATENT DOCUMENTS

JP 2005-005808 1/2005

* cited by examiner

*Primary Examiner*—Ernest Karlsen
*Assistant Examiner*—Arleen M. Vazquez
(74) *Attorney, Agent, or Firm*—Nixon Peabody LLP; Donald R. Studebaker

(57) ABSTRACT

An extremal voltage detector produces an output voltage from an operational amplifier having its non-inverting input terminal connected to a first node and its inverting input terminal connected to a second node. A number of identical metal-oxide-semiconductor field-effect transistors (MOSFETs) controlled by respective input voltages are connected in parallel between the first node and a first power supply terminal. Another identical MOSFET, controlled by the output voltage, is connected between the second node and the first power supply terminal. Alternatively, a plurality of identical MOSFET detection circuits, controlled by the input and output voltages, are connected in parallel between the first power supply node and the first and second nodes. A pair of constant-current circuits conduct equal currents from the first and second nodes to a second power-supply terminal.

10 Claims, 2 Drawing Sheets

VDD
OUT
3
OP
+
−
$10_n$
$10_2$
$10_1$
5
2
GND
N1
N2
N3
N4
11
12
13
14
IN1
IN2
INn

EXTREMAL VOLTAGE DETECTOR WITH HIGH INPUT IMPEDANCE

BACKGROUND OF THE INVENTION

1. Field of the Invention

The present invention relates to an extremal voltage detector, more specifically to a maximum voltage detector for detecting the highest of a plurality of input voltages and a minimum voltage detector for detecting the lowest of a plurality of input voltages.

2. Description of the Related Art

FIG. 1 is a schematic diagram of a conventional maximum value detector disclosed in Japanese Patent Application Publication No. 2005-5808.

This detector generates an output voltage z equal to the highest among three input voltages x1 to x3. The detector comprises npn transistors Q11 to Q13 receiving input voltages x1 to x3 at their bases, an npn transistor Q1*r* that generates the output voltage z by feedback at its base, a current source Jt for driving npn transistors Q11 to Q13 and Q1*r*, and pnp transistors Q21 to Q23 and Q2*r* for feeding identical currents to the turned-on transistors among npn transistors Q11 to Q13 and Q1*r*. Transistors Q11 to Q13 and Q1*r* are formed so as to have identical VBE-IE (base-emitter voltage vs. emitter current) characteristics.

The detector also has npn transistors Q31 to Q33 and pnp transistors Q41 to Q43 that control the base currents of pnp transistors Q21 to Q23, current sources J1 to J3 for driving respective npn transistors Q31 to Q33, and an output impedance converter F. The impedance converter F comprises an npn transistor Qa driven by a current source Ja and a pnp transistor Qb driven by another current source Jb.

The emitters of npn transistors Q11 to Q13 and Q1*r* are connected in common to current source Jt, and their collectors are connected through respective transistors Q21 to Q23 and Q2*r* to a terminal from which they receive a power supply potential VCC. The base of transistor Q1*r* is connected to the emitter of pnp transistor Qb in the impedance converter F.

Transistors Q31 to Q33 have their collectors all connected to the power supply potential (VCC), their bases connected to the collectors of respective transistors Q21 to Q23, and their emitters connected to respective current sources J1 to J3. Transistors Q41 to Q43 have their bases connected to the emitters of respective transistors Q31 to Q33, their emitters connected to the bases of respective transistors Q21 to Q23, and their collectors all connected to ground (GND).

The bases of transistors Q21 to Q23 are connected in common to the base of transistor Q2*r*, forming a current mirror in which transistors Q21 to Q23 constitute the input side and transistor Q2*r* constitutes the output side.

Transistors Q31 to Q33, Qa, and Qb operate as emitter followers.

The operation of this circuit will be described under the assumption that input voltage x1 is the highest of the three input voltages x1 to x3.

Under this assumption, transistor Q11 pulls the emitter voltages of transistors Q11, Q12, Q13, Q1*r* up to a value V01 equal to the difference (x1−VBE1) between input voltage x1 and the base-emitter voltage VBE1 at which transistor Q11 turns on. The base-emitter voltages of transistors Q12, Q13 are less than VBE1, so while transistor Q11 is turned on, transistors Q12 and Q13 are turned off. This forces up the base voltages of transistors Q32, Q33. Because transistors Q32, Q33 operate as emitter followers, the base voltages of transistors Q42, Q43 are likewise pulled up. As a result, transistors Q42, Q43 are turned off and do not draw base current from transistors Q21, Q22, Q23, Q2*r*.

Conversely, the turned-on transistor Q11 pulls down the base voltage of emitter-follower transistor Q31, and accordingly lowers the base voltage of transistor Q41. Transistor Q41 is thereby turned on and draws base current from transistor Q21, enabling transistor Q21 to supply collector current I1 to transistor Q11. Transistor Q41 also draws base currents from transistors Q22, Q23, and Q2*r*, but the collector currents I2, I3 of transistors Q22, Q23 flow to the bases of transistors Q32, Q33, respectively, instead of to transistors Q12, Q13, which are turned off.

The voltage that appears at the base of transistor Q1*r* is obtained by adding the base-emitter voltage VBE2 of transistor Q1*r* to its emitter voltage V01. Accordingly, the output voltage z can be calculated as follows:

$$z = V01 + VBE2 = x1 - VBE1 + VBE2$$

Since transistors Q21 to Q23 and Q2*r* constitute a current mirror, transistors Q11 and Q1*r* conduct identical currents. From the identical VBE-IE characteristics of transistors Q11 and Q1*r*, it follows that their base-emitter voltages are equal (VBE1=VBE2). The output voltage z is therefore equal to input voltage x1 (z=x1), so that the highest voltage x1 among the input voltages x1 to x3 is output as the output voltage z.

Since this maximum voltage detector is a bipolar transistor circuit, however, it draws input current. In the example above, input current is drawn into the base of transistor Q11. If the voltage source connected to the base of transistor Q11 has high output impedance, the flow of input current produces a significant drop in the input voltage, which has been problematic.

If, for example, the voltage source connected to the base of transistor Q11 has an output impedance of one hundred kilohms (100 kΩ) and the base current of transistor Q11 is one milliampere (1 μA), the resulting voltage drop ΔV is 100 mV (=100 kΩ×1 μA).

Accordingly, this maximum voltage detector is inapplicable to circuits such as liquid crystal driver circuits in which a current drain of several tens on nanoamperes is enough to lead to pixel on-off malfunctions.

SUMMARY OF THE INVENTION

An object of the present invention is to provide maximum and minimum voltage detectors that do not draw input current.

The invention provides an extremal voltage detector comprising metal-oxide-semiconductor field-effect transistor (MOSFET) circuits that receive a plurality of input voltages and generate a single output voltage representing the maximum or minimum of the input voltages, depending on the circuit configuration and the types of MOSFETs employed.

The detector is powered from a first power supply terminal that supplies a first potential and a second power supply terminal that supplies a second potential. One of the two potentials may be a ground potential. The detector has a first node and a second node. A first constant-current circuit conducts a constant current between the first node and the second power supply terminal; a second constant-current circuit conducts an identical constant current between the second node and the second power supply terminal. The output voltage is produced by an operational amplifier having its non-inverting input terminal connected to the first node and its inverting input terminal connected to the second node.

In a first aspect of the invention the detector has a plurality of identical first MOSFETs, connected in parallel between the first power supply terminal and the first node, that receive the input voltages at their gates. A second MOSFET, having the same channel type and electrical characteristics as the first MOSFETs, is connected between the first power supply terminal and the second node, and receives the output voltage at its gate.

This detector detects the maximum input voltage if the first potential is higher than the second potential and the MOSFETs are n-channel (NMOS) transistors. The minimum input voltage is detected if the first potential is lower than the second potential and the MOSFETs are p-channel (PMOS) transistors.

In a second aspect of the invention the detector has a plurality of identical detection circuits connected in parallel between the first power supply terminal and the first and second nodes. Each detection circuit includes four MOSFETs. The first MOSFET has its source connected to the first node and its drain connected to the drain of the second MOSFET, and receives one of the input voltages at its gate. The second and third MOSFETs have their sources connected to the first power supply terminal and form a current mirror, their gates both being connected to the drain of the second MOSFET. The fourth MOSFET has its source connected to the second node and its drain connected to the drain of the third MOSFET, and receives the output voltage at its gate.

This detector detects the maximum input voltage if the first potential is higher than the second potential, the second and third MOSFETs are PMOS transistors, and the first and fourth MOSFETs are NMOS transistors. The minimum input voltage is detected if the first potential is lower than the second potential, the second and third MOSFETs are NMOS transistors, and the first and fourth MOSFETs are PMOS transistors.

In both aspects of the invention, since the input voltage signals are received at the gates of MOSFETs, no input current is drawn, and the maximum or minimum input voltage can be detected accurately even if some of the input signal sources have high output impedance.

DETAILED DESCRIPTION OF THE INVENTION

Figure 1:
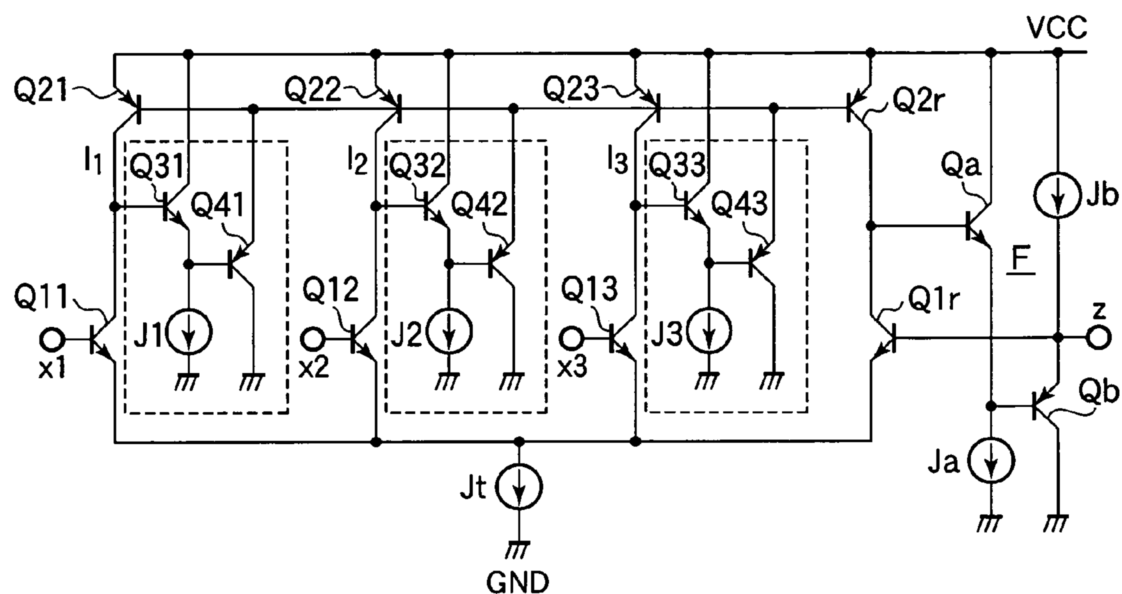
FIG. 1 is a circuit diagram of a conventional maximum voltage detector.

Embodiments of the invention will now be described with reference to the attached drawings, in which like elements are indicated by like reference characters.

First Embodiment

The first embodiment is a maximum voltage detector that detects, for example, the maximum of a plurality of pixel driving voltages to permit automatic adjustment of the luminance or contrast of a liquid crystal display. The maximum voltage detector comprises a plurality of n-channel metal-oxide-semiconductor (NMOS) transistors $\mathbf{1}_1, \mathbf{1}_2, \ldots, \mathbf{1}_n$. The gates of NMOS transistors $\mathbf{1}_1, \mathbf{1}_2, \ldots, \mathbf{1}_n$ receive, in this example, respective display-pixel driving voltages as input voltages IN1, IN2, . . . , INn.

The drains of NMOS transistors $\mathbf{1}_1, \mathbf{1}_2, \ldots, \mathbf{1}_n$ are connected to a first power supply terminal that supplies a positive potential VDD. Their sources are connected in common to a first node N1. Node N1 is connected through a constant current source 2 to a second power supply terminal that supplies zero or ground potential (GND); node N1 is also connected to the non-inverting input terminal of an operational amplifier (OP) 3.

The inverting input terminal of the operational amplifier 3 is connected to a second node N2, which is connected to the source of an NMOS transistor 4. The drain of NMOS transistor 4 is connected to the VDD terminal, and its gate is connected to the output terminal of the operational amplifier 3, from which an output voltage OUT is output. A constant current source 5 for supplying a constant current to NMOS transistor 4 is also connected between node N2 and the ground terminal.

NMOS transistors $\mathbf{1}_1$ to $\mathbf{1}_n$ and 4 are formed so as to have identical threshold voltages VT and identical gate-source voltage vs. drain current (VGS-ID) characteristics. The constant currents I supplied by constant current sources 2, 5 are also mutually equal.

Figure 2:
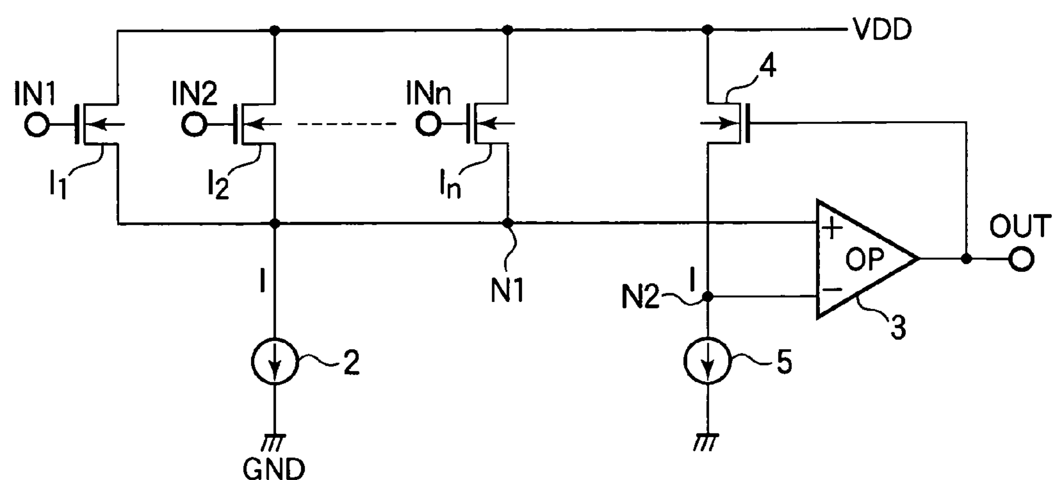
FIG. 2 is a circuit diagram of a maximum voltage detector according to a first embodiment of the invention.

Next, the operation of the circuit in FIG. 2 will be described, under the assumption that input voltage IN1 is the highest among the input voltages IN1 to INn.

The voltage VN1 at node N1 is then pulled up by NMOS transistor $\mathbf{1}_1$ to a voltage lower than the input voltage IN1 by an amount substantially equal to the threshold voltage VT of NMOS transistor $\mathbf{1}_1$ (VN1=IN1=VT). The other NMOS transistors $\mathbf{1}_2$ to $\mathbf{1}_n$ are turned off because their gate-source voltages (the difference between each of their input voltages IN2 to INn and the voltage VN1 of node N1) is less than the threshold voltage VT.

Since the output voltage OUT of the operational amplifier 3 is supplied to the gate of NMOS transistor 4, the voltage VN2 at node N2 is obtained substantially by subtracting the threshold voltage VT of NMOS transistor 4 from the output voltage OUT (VN2=OUT−VT).

Since nodes N1 and N2 are connected to the non-inverting and inverting input terminals of the operational amplifier 3, respectively, the output voltage OUT is controlled by the operational amplifier 3 so as to make the voltages VN1, VN2 at nodes N1, N2 mutually equal. That is, the operational amplifier 3 performs feedback control so as to produce the following relationship.

$$IN1-VT=OUT-VT$$

Accordingly, the relationship OUT=IN1 is obtained, which indicates that the highest voltage IN1 among the input voltages IN1 to INn is output as the output voltage OUT.

As described above, the maximum voltage detector of the first embodiment comprises NMOS transistors that receive the input voltages IN1 to INn at their gates and therefore do not draw input current. A resulting advantage is that the maximum voltage can be detected with high accuracy even if the input signal sources have high output impedance.

A maximum voltage detector has been described in the first embodiment, but a minimum voltage detector can also be configured if NMOS transistors $\mathbf{1}_1$ to $\mathbf{1}_n$ are replaced with PMOS transistors and the constant current sources 2, 5 are disposed on the VDD side of the circuit.

In the first embodiment, if a plurality of input voltages have values substantially equal to the maximum voltage, the constant current I conducted by constant current source 2 is divided into branch currents flowing through the NMOS transistors receiving these maximum input voltages. The resistive voltage drops in these NMOS transistors are thereby reduced, raising the voltage at the non-inverting input terminal of the operational amplifier and introducing the possibility that the maximum voltage will not be detected accurately. This possible inaccuracy is avoided in the second embodiment, described below.

Second Embodiment

Figure 3:
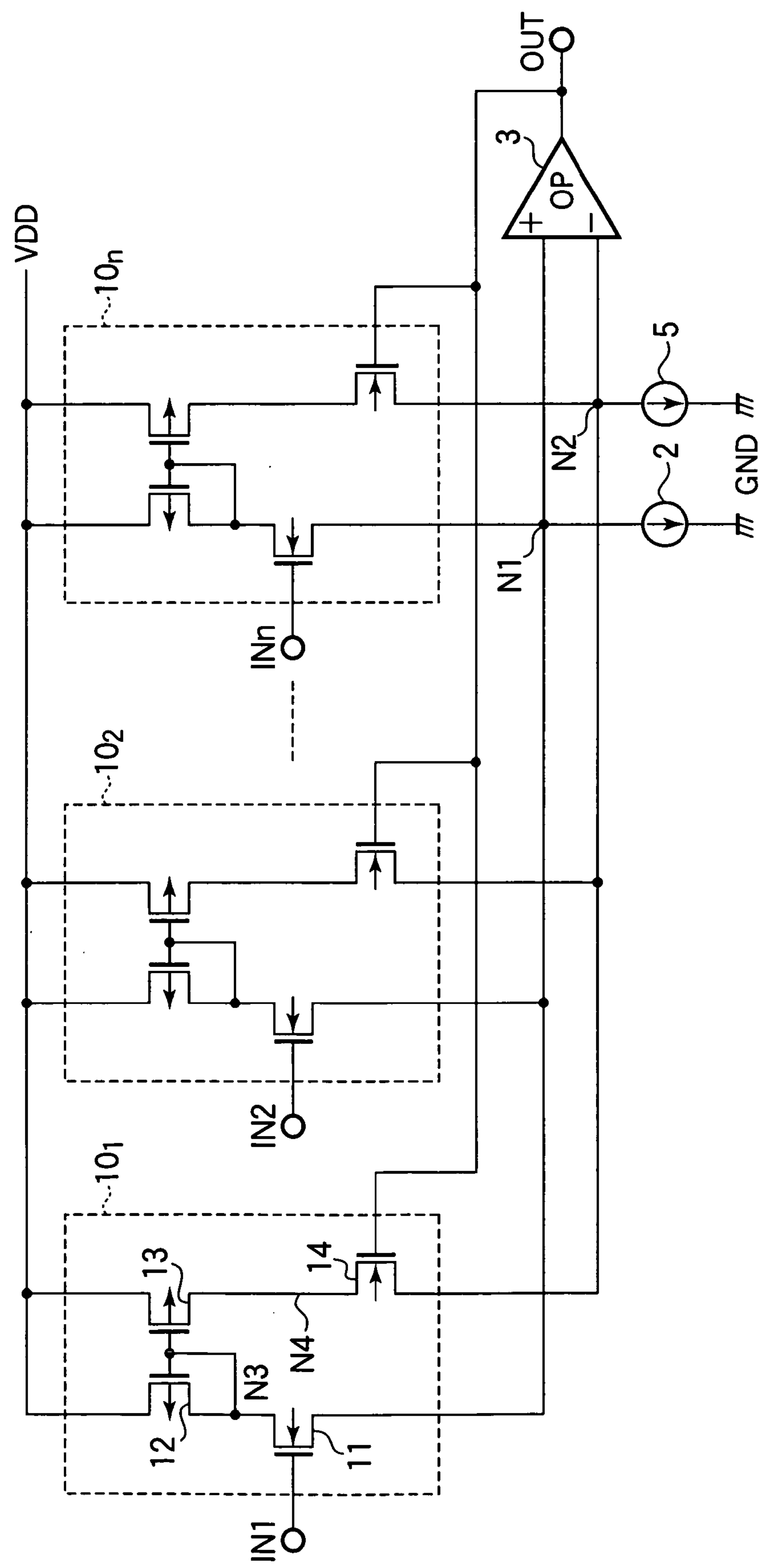
FIG. 3 is a circuit diagram of a maximum voltage detector according to a second embodiment of the invention.

Referring to FIG. 3, the second embodiment is a maximum voltage detector comprising a plurality of detection circuits $10_1$, $10_2$, . . . , $10_n$ that receive respective input voltages IN1, IN2, . . . , INn. The detection circuits $10_1$, $10_2$, . . . , $10_n$ have identical structures comprising NMOS transistors 11, 14 and PMOS transistors 12, 13.

In detection circuit $10_1$, NMOS transistor 11 receives input voltage IN1 at its gate, has its source connected to a first node N1, and has its drain connected to a first internal node N3. To this node N3 are connected the gates of PMOS transistors 12, 13 and the drain of PMOS transistor 12. The sources of PMOS transistors 12, 13 are connected to the VDD terminal. PMOS transistors 12, 13 thus constitute a current mirror. The drain of PMOS transistor 13 is connected to a second internal node N4, which is connected to the drain of NMOS transistor 14. The source of NMOS transistor 14 is connected to a second node N2, and its gate receives the output voltage (OUT) of the maximum voltage detector from an operational amplifier 3.

Similarly, in each of the detection circuits $10_2$ to $10_n$ that receive input voltages IN2 to INn, the sources of the NMOS transistors 11, 14 are connected to respective nodes N1, N2, and the gate of NMOS transistor 14 receives the output voltage OUT.

The constant current sources 2, 5 are connected between node N1 and ground and between node N2 and ground, respectively. The non-inverting and inverting input terminals of the operational amplifier 3 are connected to respective nodes N1, N2. The output terminal of the operational amplifier 3 outputs the output signal OUT. In each of the detection circuits $10_1$ to $10_n$, PMOS transistors 12, 13 have the same gate length and width and NMOS transistors 11, 14 also have the same gate length and width. The constant current sources 2, 5 conduct equal currents.

Next, the operation of the circuit in FIG. 3 will be described under the assumption that input voltage IN1 is the highest among the input voltages IN1 to INn.

The source voltage of NMOS transistor 11 in detection circuit 101 (voltage VN1 at node N1) then becomes lower than the input voltage IN1 by substantially the threshold voltage VT of this NMOS transistor 11, so the difference between each of the other input voltages IN2 to INn and voltage VN1 is less than the threshold voltage VT, causing the NMOS transistors 11 in detection circuits $10_2$ to $10_n$ to turn off.

The voltage VN1 at node N1 is not precisely equal to the voltage obtained by subtracting the threshold voltage VT from the input voltage IN1. Since NMOS transistor 11 has an on-resistance R1, if the current flowing through NMOS transistor 11 (the current supplied by the constant current source 2) is denoted I, the voltage VN1 is given by the following equation:

$$VN1=IN1-VT-(R1\times I)$$

The current I flowing through NMOS transistor 11 also flows through the PMOS transistor 12 connected in series with NMOS transistor 11, and an identical current flows through PMOS transistor 13 and NMOS transistor 14, because PMOS transistors 12 and 13 constitute a current mirror. Since the gate of NMOS transistor 14 receives the output voltage OUT, if the on-resistance of NMOS transistor 14 is denoted R4, the voltage VN2 at node N2 is given by the following equation:

$$VN2=\mathrm{OUT}-VT-(R4\times \mathrm{I})$$

Since nodes N1, N2 are connected to the non-inverting and inverting input terminals of the operational amplifier 3, respectively, the output voltage OUT is controlled by the operational amplifiers 3 so as to make the voltages VN1, VN2 at the nodes N1, N2 mutually equal. That is, the operational amplifier 3 performs feedback control so as to produce the following relationship.

$$IN1-VT-(R1\times I)=\mathrm{OUT}-VT-(R4\times \mathrm{I})$$

Since NMOS transistors 11, 14 are identically dimensioned, the condition R1=R4 is satisfied. Accordingly, the above equation reduces to OUT=IN1, which implies that the highest voltage IN1 among the input voltages IN1 to INn is output as the output voltage OUT.

Next, it will assumed that the input voltages IN1, IN2 among the input voltages IN1 to INn have substantially the same voltage VMAX, which is higher than the other input voltages IN3 to INn.

In this case, the two NMOS transistors 11 in detection circuits 101 and 102 are simultaneously turned on, and the current I supplied from constant current source 2 is divided into two equal branch currents. The voltage VN1 at node N1 is now given by the following equation:

$$VN1=V\mathrm{MAX}-VT-(R1\times I/2)$$

In both of these detection circuits $10_1$, $10_2$, a current having the same value (I/2) also flows through the mirroring PMOS transistor 13 and NMOS transistor 14. Therefore, the voltage VN2 at node N2 is given by the following equation:

$$VN2=V\mathrm{MAX}-VT-R4\times(I/2)$$

Since nodes N1 and N2 are connected to the non-inverting and inverting input terminals of the operational amplifier 3, respectively, the output voltage OUT is controlled by the operational amplifier 3 so that the voltages VN1, VN2 at the respective nodes N1, N2 are mutually equal. That is, the operational amplifier 3 performs feedback control so as to establish the following relationship.

$$V\mathrm{MAX}-VT-(R1\times I/2)=\mathrm{OUT}-VT-(R4\times I/2)$$

Since R1=R4 as noted above, the above equation reduces to OUT=VMAX. This implies that even if a plurality of the input voltages IN1 to INn have the maximum voltage VMAX, this voltage VMAX is correctly output as the output voltage OUT.

As described above, the maximum voltage detector of the second embodiment comprises NMOS transistors that receive the input voltages IN1 to INn at their gates, so that no input current is drawn and the same advantage as in the first embodiment is obtained.

Further, the maximum voltage detector of the second embodiment has current mirror detection circuits $10_1$ to $10_n$ that receive the input voltages IN1 to INn, each of the detection circuits $10_1$ to $10_n$ including an NMOS transistor 11 that conducts current in response to the input voltage and an NMOS transistor 14 that conducts a mirrored current. Feedback control brings the voltage VN2 at the node N2 to which the sources of NMOS transistors 14 are connected to the same level as the voltage VN1 at the node N1 to which the sources of NMOS transistors 11 are connected. An advantage of the second embodiment is that regardless of the number of input voltages having the maximum value, the maximum voltage is detected with high accuracy because the NMOS transistors 11, 14 conduct equal currents in each of the detection circuits 10.

A maximum voltage detector has been described in the second embodiment, but a minimum voltage detector can also be obtained by replacing NMOS transistors with PMOS transistors and vice versa and interchanging the power supply and ground potentials.

Those skilled in the art will recognize that further variations are possible within the scope of the invention, which is defined in the appended claims.

What is claimed is:

1. An extremal voltage detector for receiving a plurality of input voltages and producing an output voltage equal to an extremal one of the input voltages, comprising:

a first power supply terminal supplying a first potential;

a second power supply terminal supplying a second potential different from the first potential;

a first node;

a second node;

a plurality of first metal-oxide-semiconductor field-effect transistors (MOSFETs) connected in parallel between the first power supply terminal and the first node, the first MOSFETs having identical electrical characteristics, each first MOSFET having a gate, receiving one of the input voltages at said gate, and conducting current responsive to the received input voltage;

a second MOSFET having the same electrical characteristics as the first MOSFETs, connected between the first power supply terminal and the second node, the second MOSFET having a gate, receiving the output voltage at said gate, and conducting current responsive to the output voltage;

a first constant-current circuit conducting a first constant current between the first node and the second power supply terminal;

a second constant-current circuit conducting a second constant current, equal to the first constant current, between the second node and the second power supply terminal; and an operational amplifier having a non-inverting input terminal connected to the first node, an inverting input terminal connected to the second node, and an output terminal at which the output voltage is produced.

2. The extremal voltage detector of claim 1, wherein the first potential is higher than the second potential, and the first MOSFETs and the second MOSFET are n-channel transistors, the output voltage being equal to a maximum one of the input voltages.

3. The extremal voltage detector of claim 2, wherein the second potential is a ground potential.

4. The extremal voltage detector of claim 1, wherein the first potential is lower than the second potential, and the first MOSFETs and the second MOSFET are p-channel transistors, the output voltage being equal to a minimum one of the input voltages.

5. The extremal voltage detector of claim 4, wherein the first potential is a ground potential.

6. An extremal voltage detector for receiving a plurality of input voltages and producing an output voltage equal to an extremal one of the input voltages, comprising:

a first power supply terminal supplying a first potential;

a second power supply terminal supplying a second potential different from the first potential;

a first node;

a second node;

a plurality of detection circuits having mutually identical circuit configurations and mutually identical electrical characteristics, each detection circuit receiving the output voltage and one of the input voltages, conducting current between the first power supply terminal and the first node, and conducting current between the first power supply terminal and the second node;

a first constant-current circuit conducting a first constant current between the first node and the second power supply terminal;

a second constant-current circuit conducting a second constant current, equal to the first constant current, between the second node and the second power supply terminal; and an operational amplifier having a non-inverting input terminal connected to the first node, an inverting input terminal connected to the second node, and an output terminal at which the output voltage is produced;

wherein each one of the plurality of detection circuits includes:

a first internal node;

a second internal node;

a first metal-oxide-semiconductor field-effect transistor (MOSFET) of a first channel type having a source connected to the first node, a gate receiving said one of the input voltages, and a drain connected to the first internal node;

a second MOSFET of a second channel type having a source connected to the first power supply terminal, a gate connected to the first internal node, and a drain connected to the first internal node;

a third MOSFET of the second channel type having a source connected to the first power supply terminal, a gate connected to the first internal node, and a drain connected to the second internal node, conducting current mirroring the current conducted by the second MOSFET; and a fourth MOSFET of the first channel type having a source connected to the second node, a gate receiving the output voltage, and a drain connected to the second internal node.

7. The extremal voltage detector of claim 6, wherein the first potential is higher than the second potential, the first and fourth MOSFETs are n-channel transistors, and the second and third MOSFETs are p-channel transistors, the output voltage being equal to a maximum one of the input voltages.

8. The extremal voltage detector of claim 7, wherein the second potential is a ground potential.

9. The extremal voltage detector of claim 6, wherein the first potential is lower than the second potential, the first and fourth MOSFETs are p-channel transistors, and the second and third MOSFETs are n-channel transistors, the output voltage being equal to a minimum one of the input voltages.

10. The extremal voltage detector of claim 9, wherein the first potential is a ground potential.

* * * * *